US010030671B2

(12) United States Patent
Tamaoka et al.

(10) Patent No.: US 10,030,671 B2
(45) Date of Patent: Jul. 24, 2018

(54) HEAT MODULE (71) Applicant: Nidec Corporation, Kyoto (JP)

(72) Inventors: Takehito Tamaoka, Kyoto (JP);
Kazuhiko Fukushima, Kyoto (JP);
Koji Hatanaka, Kyoto (JP)

(73) Assignee: NIDEC CORPORATION, Kyoto (JP)

( * ) Notice: Subject to any disclaimer, the term of this patent is extended or adjusted under 35 U.S.C. 154(b) by 343 days.

(21) Appl. No.: 14/629,874

(22) Filed: Feb. 24, 2015

(65) Prior Publication Data
US 2016/0003261 A1  Jan. 7, 2016

(30) Foreign Application Priority Data

Jul. 4, 2014  (JP) ................. 2014-138168

(51) Int. Cl.
*F04D 29/58* (2006.01)
*F04D 19/00* (2006.01)
*F04D 25/06* (2006.01)
*F04D 17/16* (2006.01)
*F04D 29/42* (2006.01)
*H05K 7/20* (2006.01)
(Continued)

(52) U.S. Cl.
CPC .......... *F04D 29/584* (2013.01); *F04D 17/16* (2013.01); *F04D 19/002* (2013.01); *F04D 25/0613* (2013.01); *F04D 29/582* (2013.01); *F04D 29/42* (2013.01); *F04D 29/4206* (2013.01); *F04D 29/4226* (2013.01); *G06F 1/20* (2013.01); *G06F 1/203* (2013.01); *G06F 1/206* (2013.01); *H01L 23/427* (2013.01); *H05K 7/20172* (2013.01)

(58) Field of Classification Search
CPC .... F04D 29/584; F04D 29/42; F04D 29/4206; F04D 29/4226; F04D 17/16; H01L 23/427; G06F 1/20; G06F 1/203; G06F 1/206; H05K 7/20172
See application file for complete search history.

(56) References Cited

U.S. PATENT DOCUMENTS 6,407,921 B1 * 6/2002 Nakamura ............... G06F 1/203
165/104.33
6,408,934 B1   6/2002 Ishida et al.
(Continued)

FOREIGN PATENT DOCUMENTS

JP   2000-124372 A   4/2000
JP   2000-216575 A   8/2000
(Continued)

*Primary Examiner* — Justin Seabe
*Assistant Examiner* — Behnoush Haghighian
(74) *Attorney, Agent, or Firm* — Westerman, Hattori, Daniels & Adrian, LLP (57) ABSTRACT The fan includes an impeller, a motor, and a housing. The housing includes a side wall portion and a lower plate portion. at least one of the lower plate portion and an upper plate portion arranged to cover an upper side of the impeller includes an air inlet. The upper plate portion, the side wall portion, and the lower plate portion are arranged to together define an air outlet on a lateral side of the impeller. At or near an opposite end of the heat pipe, the heat pipe includes a contact portion arranged to be in contact with one of an upper surface of the lower plate portion and a lower surface of the upper plate portion. A longitudinal direction of at least a portion of the heat pipe extends at an angle with respect to the air outlet.

18 Claims, 6 Drawing Sheets

(51) Int. Cl.
    *H01L 23/427*     (2006.01)
    *G06F 1/20*     (2006.01)

(56) References Cited

U.S. PATENT DOCUMENTS

| | | | |
|---|---|---|---|
| 9,025,328 B2* | 5/2015 | Chiang | H05K 7/20154 361/679.47 |
| 9,458,852 B2* | 10/2016 | Yoo | F04D 17/16 |
| 2010/0074742 A1* | 3/2010 | Koo | F04D 29/422 415/204 |
| 2012/0055653 A1* | 3/2012 | Chen | F04D 29/441 165/121 |
| 2013/0264033 A1* | 10/2013 | Huang | G06F 1/203 165/104.26 |
| 2014/0119906 A1* | 5/2014 | Lin | F04D 25/0613 415/203 |
| 2014/0290918 A1* | 10/2014 | Chen | G06F 1/203 165/121 |

FOREIGN PATENT DOCUMENTS

| | | |
|---|---|---|
| JP | 2006-128388 A | 5/2006 |
| JP | 2012-018683 A | 1/2012 |
| JP | 2013-140501 A | 7/2013 |

\* cited by examiner

HEAT MODULE

BACKGROUND OF THE INVENTION

1. Field of the Invention

The present invention relates to a heat module. In particular, the present invention relates to a heat module installed in an electronic device, such as, for example, a personal computer (PC).

2. Description of the Related Art

Small and high-performance electronic devices, such as, for example, notebook PCs, produce a large amount of heat at CPUs and the like inside cases thereof. This makes it important to take measures against the heat. One common measure against the heat is to install blower fans inside the cases to discharge the heat.

JP-A 2012-018683, for example, discloses a method of cooling a heat source as employed in an electronic device including a fan arranged to blow air toward a closed space, a heat dissipating member arranged between the closed space and the fan inside a case and arranged to cover an air outlet, and a heat pipe arranged to be in thermal connection with a heat-radiating component and the heat dissipating member and arranged in the closed space so as to cover a portion of the heat dissipating member. According to this method, the air blown by the fan toward the closed space changes its direction of travel outside of the fan because of the heat pipe, and is discharged through the air outlet.

According to the method disclosed in JP-A 2012-018683, the heat pipe blocks a flow of the air. That is, the air blown by the fan is caused by the heat pipe to change its direction of travel, and a change in the direction of the flow of the air causes an energy loss. In addition, noise occurs if an air current strikes the heat pipe hard. Further, according to the method disclosed in JP-A 2012-018683, the heat dissipating member (i.e., a heat sink) is arranged between the fan and the heat pipe. A reduction in the thickness of a heat module requires a reduction in the thickness of the fan, and the reduction in the thickness of the fan results in a reduction in an air volume. When the heat sink is provided, the heat sink itself narrows an air channel through which the air current passes, and causes an increase in air resistance. Thus, according to an invention of JP-A 2012-018683, energy losses caused by the air resistance and the change in the direction of the flow of the air are great. That is, the invention of JP-A 2012-018683 is not suitable to reduce the thickness of the heat module.

SUMMARY OF THE INVENTION

A heat module according to a preferred embodiment of the present invention includes a fan and a heat pipe arranged to be in thermal contact with a heat source at or near one end thereof, and arranged to be in thermal contact with the fan at or near an opposite end thereof. The fan includes an impeller, a motor, and a housing. The impeller includes a plurality of blades arranged in a circumferential direction about a central axis extending in a vertical direction. The motor is arranged to rotate the impeller. The housing is arranged to accommodate the impeller and the motor. The housing includes a side wall portion and a lower plate portion. The side wall portion is arranged to cover a lateral side of the impeller, and includes at least one opening each of which opens into an exterior space outside of the fan, each of the at least one opening extending over a circumferential extent. The lower plate portion is arranged to be in contact with the side wall portion, and is arranged to support the impeller through the motor such that the impeller is rotatable. at least one of the lower plate portion and an upper plate portion arranged to cover an upper side of the impeller includes an air inlet. The upper plate portion, the side wall portion, and the lower plate portion are arranged to together define an air outlet on the lateral side of the impeller. The air outlet is a plane parallel to the central axis and including one of an edge of the upper plate portion, a pair of edges which are circumferential ends of the opening of the side wall portion, and an edge of the lower plate portion that is the closest to the central axis. At or near the opposite end of the heat pipe, the heat pipe includes a contact portion arranged to be in contact with one of an upper surface of the lower plate portion and a lower surface of the upper plate portion. A longitudinal direction of at least a portion of the heat pipe extends at an angle with respect to the air outlet.

The heat module according to the above preferred embodiment of the present invention is able to achieve an improved ability to cool a heat source while achieving a reduction in the thickness thereof.

The above and other features, elements, steps, characteristics and advantages of the present invention will become more apparent from the following detailed description of preferred embodiments of the present invention with reference to the attached drawings.

DETAILED DESCRIPTION OF THE PREFERRED EMBODIMENTS

Figure 1:
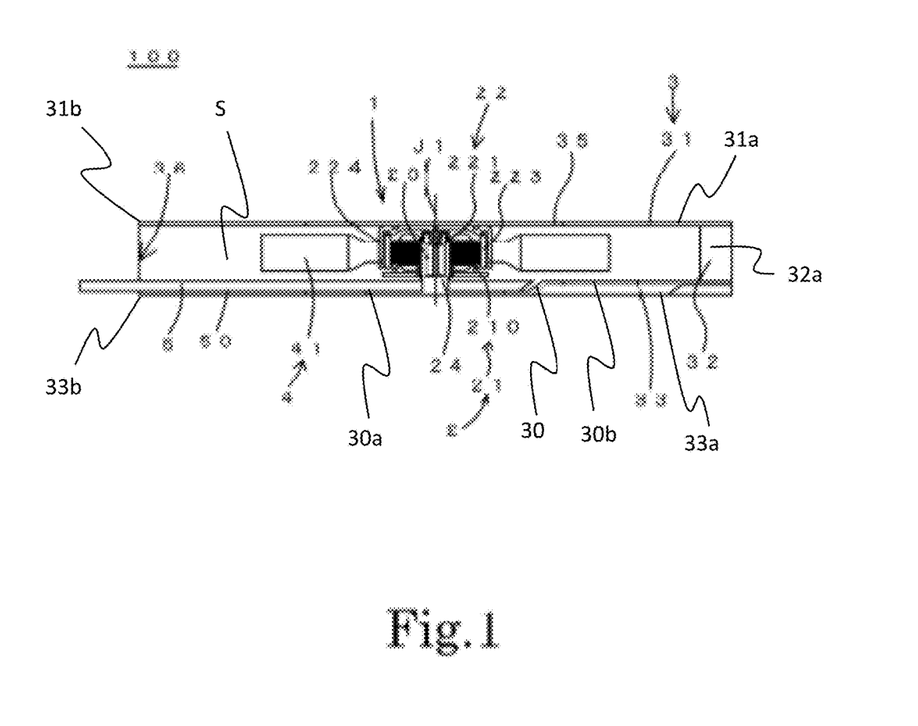
FIG. 1 is a cross-sectional view of a heat module according to a first preferred embodiment of the present invention.

It is assumed herein that an upper side and a lower side in an axial direction parallel to a central axis of a fan 1 of a heat module 100 in FIG. 1 are referred to simply as an upper side and a lower side, respectively. Note that a vertical direction assumed herein may not necessarily correspond with a vertical direction of the heat module 100 when the heat module 100 has been actually installed in a device. It is also assumed herein that a circumferential direction about the central axis is referred to simply by the term "circumferential direction", "circumferential", or "circumferentially", and that radial directions centered on the central axis are referred to simply by the term "radial direction", "radial", or "radially".

Figure 2:
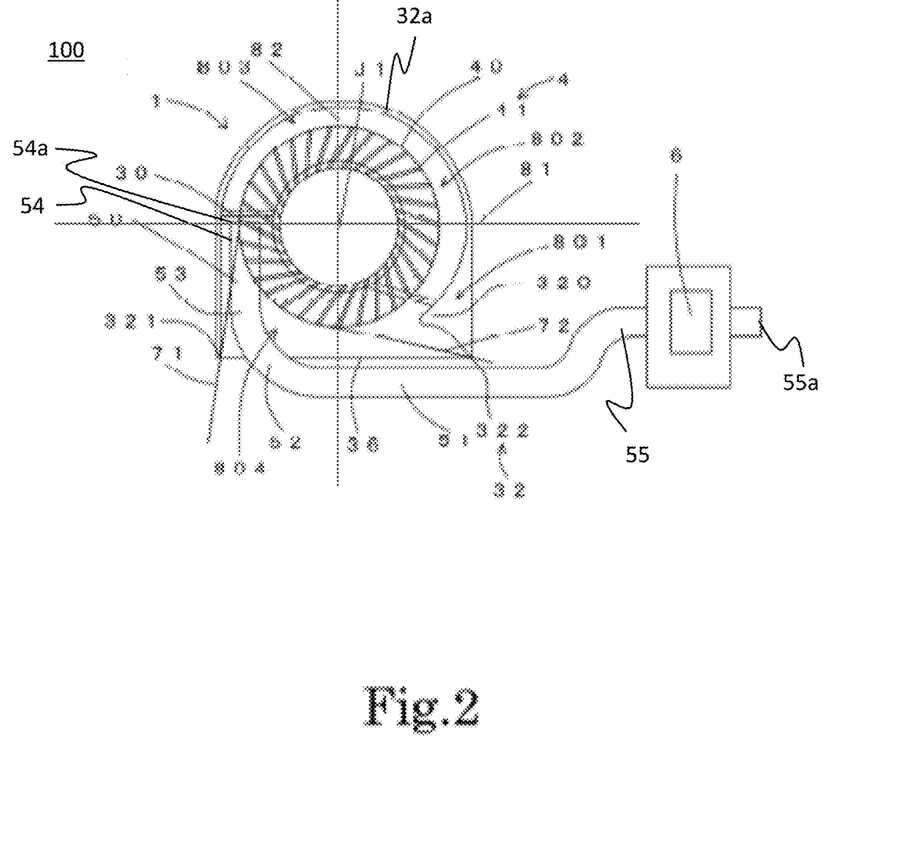
FIG. 2 is a top view of the heat module according to the first preferred embodiment of the present invention.

FIG. 1 is a cross-sectional view of the heat module 100 according to a first preferred embodiment of the present invention. FIG. 2 is a top view of the heat module 100 according to the first preferred embodiment of the present invention. The heat module 100 includes the fan 1, which is arranged to blow air in a predetermined direction, and a heat pipe 5 arranged to be in thermal contact with a heat source 6 at or near one end thereof and arranged to be in thermal contact with the fan 1 at or near an opposite end thereof. The fan 1 is a centrifugal fan. The heat module 100 is, for example, installed in a notebook personal computer (hereinafter referred to as a "notebook PC"), and is used to cool devices inside a case of the notebook PC.

The fan 1 includes a motor 2, a housing 3, and an impeller 4. The impeller 4 includes a plurality of blades 41 arranged in a circumferential direction about a central axis J1 extending in a vertical direction. The motor 2 is arranged to rotate the impeller 4 about the central axis J1. The housing 3 is arranged to accommodate the motor 2 and the impeller 4.

The motor 2 is an outer-rotor motor. The motor 2 includes a stationary portion 21, which is a stationary assembly, a rotating portion 22, which is a rotating assembly, and a sleeve 23, which is a bearing. The sleeve 23 is substantially cylindrical, and is centered on the central axis J1. The rotating portion 22 is supported by the sleeve 23 to be rotatable about the central axis J1 with respect to the stationary portion 21.

The stationary portion 21 includes a stator 210 and a bearing holding portion 24. The bearing holding portion 24 is arranged to accommodate the sleeve 23. The bearing holding portion 24 is substantially cylindrical, is centered on the central axis J1, and is made of a resin. The bearing holding portion 24 is arranged to project upward from a substantial center of a lower plate portion 33 described below. The bearing holding portion 24 is fixed in a hole portion (not shown) defined in the lower plate portion 33. A lower end portion of the bearing holding portion 24 and a portion of the lower plate portion 33 around the hole portion (not shown) are joined to each other through insert molding.

The stator 210 is annular, is centered on the central axis J1, and is attached to an outside surface of the bearing holding portion 24. The stator 210 includes a stator core (not shown) and a plurality of coils (not shown).

The rotating portion 22 includes a shaft 221, a rotor magnet 223, and a cup 224. The cup 224 is substantially in the shape of a covered cylinder and centered on the central axis J1. The cup 224 is arranged to be open downwardly. The shaft 221 is centered on the central axis J1, and an upper end portion of the shaft 221 is fixed to the cup 224. The rotor magnet 223 is substantially cylindrical, is centered on the central axis J1, and is fixed to an inside surface of the cup 224.

The shaft 221 is inserted in the sleeve 23. The sleeve 23 is defined by an oil-bearing porous metal body, and is inserted and fixed in the bearing holding portion 24. Note that a ball bearing, for example, may be used as a bearing mechanism.

The housing 3 includes an upper plate portion 31, a side wall portion 32, and the lower plate portion 33. The upper plate portion 31 is arranged to cover an upper side of the impeller 4. The side wall portion 32 is arranged to cover a lateral side of the impeller 4. Referring to FIG. 2, the side wall portion 32 includes a tongue portion 320 arranged to project between an air outlet 36 and the impeller 4. The lower plate portion 33 is arranged to be in contact with the side wall portion 32, and is arranged to support the impeller 4 through the motor 2 such that the impeller 4 is rotatable. The upper plate portion 31, the side wall portion 32, and the lower plate portion 33 are arranged to together define an air channel portion (not shown) which surrounds the impeller 4. An entire edge of the upper plate portion 31 consists of a first part 31a and a second part 31b, and an entire edge of the lower plate portion 33 consists of a third part 33a and a fourth part 33b. The side wall portion 32 includes a curved portion 32a.

According to the present preferred embodiment, the lower plate portion 33, with which the heat pipe 5 is arranged to be in contact, is made of a material having excellent thermal conductivity. For example, the lower plate portion 33 is made of an aluminum alloy and is molded by die casting. Note that the heat pipe 5 may alternatively be arranged to be in contact with the upper plate portion 31. In this case, the upper plate portion 31 is made of a material having excellent thermal conductivity. For example, the upper plate portion 31 may be made of an aluminum alloy and molded by die casting. When the lower plate portion 33 is arranged to be in thermal contact with the heat pipe 5, heat can be transferred from the heat pipe 5 to the lower plate portion 33. Thus, an improvement in a heat dissipation characteristic of the heat pipe 5 can be achieved. The side wall portion 32 is made of an aluminum alloy, and is molded by die casting. Alternatively, the side wall portion 32 may be molded of a resin. A lower end portion of the side wall portion 32 and an edge portion of the lower plate portion 33 are fastened to each other by, for example, screws. The upper plate portion 31 is fixed to an upper end portion of the side wall portion 32 by, for example, crimping. At least one of the upper and lower plate portions 31 and 33 includes an air inlet 35. That is, the air inlet 35 is arranged above or below the impeller 4. According to the present preferred embodiment, the air inlet 35 is defined in each of the upper plate portion 31 and the lower plate portion 33. Note, however, that, only one of the upper plate portion 31 and the lower plate portion 33 may include the air inlet 35. In short, at least one of the upper plate portion 31 and the lower plate portion 33 includes the air inlet 35.

The air outlet 36 is defined by the upper plate portion 31, the side wall portion 32, and the lower plate portion 33 on the lateral side of the impeller 4. The air outlet 36 is arranged to open radially outwardly in the housing 3. The air outlet 36 is a plane parallel to the central axis J1 and including one of an edge of the upper plate portion 31, a pair of edges which are circumferential ends of an opening of the side wall portion 32, and an edge of the lower plate portion 33 that is the closest to the central axis J1. An inside space S is formed by surrounding the upper plate portion 31, the side wall portion 32 and the lower plate portion 33.

The impeller 4 includes the plurality of blades 41. The blades 41 are arranged in an annular shape with the central axis J1 as a center radially outside of the cup 224. A radially inner end portion of each blade 41 is fixed to an outside surface of the cup 224. A torque centered on the central axis J1 is produced between the rotor magnet 223 and the stator 210 as a result of supply of electric currents to the stationary portion 21. The impeller 4 is thus caused to rotate about the central axis J1 together with the rotating portion 22. Rotation of the impeller 4 causes air to be drawn into the housing 3 through the air inlet 35, and to be sent out through the air outlet 36.

FIG. 2 is the top view of the heat module 100 according to the first preferred embodiment of the present invention. A rotation direction of the fan 1 is indicated by an arrow in FIG. 2. The heat pipe 5 is arranged to be in thermal contact with the heat source 6 at or near the one end thereof, and is arranged to be in thermal contact with the fan 1 at or near the opposite end thereof. At or near the opposite end of the heat pipe 5, a lower surface of the heat pipe 5 includes a contact portion 50 arranged to be in contact with an upper surface of the lower plate portion 33. The contact portion 50 is fixed to the upper surface of the lower plate portion 33 through a solder. Note that the contact portion 50 may alternatively be fixed to the upper surface of the lower plate portion 33 through an adhesive or a thermal sheet having excellent thermal conductivity, or may alternatively be fixed thereto through welding. Also note that the contact portion 50 may alternatively be included in an upper surface of the heat pipe 5. In this case, the contact portion 50 is arranged to be in contact with a lower surface of the upper plate portion 31. The heat pipe 5 includes a first end region 54 including a first end 54a, and a second end region 55 including a second end 55a. The impeller has a rotation direction so that the side wall portion 32 in the plan view extends from an upstream end 322 close to an upstream of the rotation direction of the impeller to a downstream end 321 close to a downstream of the rotation direction of the impeller.

The heat pipe is generally used to transfer heat from a heat source to a heat sink. That is, heat of the heat source is transferred to the heat sink, and a cooling air is supplied to the heat sink, whereby the heat source is cooled. The heat sink includes a plurality of fins, and is arranged at an air outlet of a fan. In this case, the heat sink blocks passage of an exhaust air of the fan. That is, the heat sink applies a load to the fan, and thus decreases an air volume of the fan. This problem cannot be avoided when heat dissipation depends on the heat sink. Accordingly, according to the present preferred embodiment, an air current is directly supplied to the heat pipe to accomplish forced cooling of the heat pipe. The surface area of the heat pipe is smaller than that of a comparable heat sink, and it is therefore necessary to increase a surface area of the heat pipe which the air current strikes. For example, a water-cooled radiator or the like is typically arranged in the vicinity of an air outlet of a fan to increase heat dissipation efficiency. Meanwhile, in the heat module 100, which has a small thickness, the air volume of the fan 1 is small, and the amount of air supplied may not be sufficient. In addition, an increase in a radiating area of the radiator may cause a partial blockage of an air channel. In a heat module having a large thickness, it is possible to increase the number of fins and secure a sufficient space through which the air current passes the radiator. However, in the heat module 100, which has a small thickness, it may be impossible to secure a sufficient air channel through which air passes the radiator. Moreover, a water-cooled heat module is more expensive than a comparable air-cooled heat module. Accordingly, in a situation in which an inexpensive air-cooled heat module is wanted in accordance with specifications of the fan, it is difficult to arrange a radiator, such as a radiator used in the water-cooled heat module, in which a large space through which a coolant passes is secured in the vicinity of the air outlet of the fan.

The heat pipe 5 typically includes a pipe made of a material having a high thermal conductivity, such as, for example, copper or aluminum, and a capillary structure and a coolant arranged inside the pipe. That is, the heat pipe 5 is arranged to dissipate heat while transferring heat. That is, in the heat module 100 according to the present preferred embodiment, a longitudinal direction of the heat pipe 5 extends at an angle with respect to the plane defining the air outlet 36 in a space to which the air current is supplied in the vicinity of the air outlet 36. Thus, the area of an orthographic projection of the heat pipe 5 onto the air outlet 36 is increased. In other words, a surface area over which the air current strikes the heat pipe 5 is increased. According to the present preferred embodiment, the heat pipe 5 has a flat cross section. When the heat pipe 5 has a flat cross section, the size of an air channel through which the air current caused by the rotation of the impeller 4 passes is increased. Thus, a load on the fan 1 is reduced, and a large amount of air can be supplied to a surface of the heat pipe 5.

The heat pipe 5 is arranged on the lower plate portion 33. Generally, once an air current is discharged through the air outlet of the fan, the air current diffuses because of absence of an air channel. That is, the density of air of the air current decreases as the air current goes away from the air outlet. Meanwhile, according to the present preferred embodiment, the lower plate portion 33 is arranged to extend radially outward beyond the air outlet 36, and air which has been discharged through the air outlet 36 travels above the lower plate portion 33, and does not easily diffuse. Thus, the density of air of the air current can be maintained at a high level when the air current passes near the heat pipe 5, leading to an improvement in a cooling characteristic of the heat module 100.

The heat module 100 according to the present preferred embodiment has a small thickness. Since the heat pipe 5 has an internal structure (i.e., the capillary structure and the coolant), the thickness of the heat pipe 5 can be reduced only to a limited extent. As the thickness of the fan 1 is reduced, the proportion of the volume of the heat pipe 5 in the fan 1 is increased. That is, the surface area of the heat pipe 5 is relatively increased for the air volume of the fan 1. Therefore, even without a heat sink, the heat dissipation characteristic can be maintained. In addition, in the heat module 100 having a small thickness, if a heat sink is arranged above or below the heat pipe 5, a sufficient interspace needs to be secured between adjacent fins of the heat sink to secure a sufficient space through which the air current passes. In this case, the interspace between the adjacent fins is relatively large for the size of the fan when compared to the case where the fan has a larger thickness, and therefore, a sufficient radiating area cannot be secured. In addition, in the heat module 100 having a small thickness, the axial height of each fin is small, and a radiating area of each fin is small. In the case where no heat sink is provided, a sufficient air channel can be secured, and therefore, the air current is allowed to strike the heat pipe 5 without a reduction in the air volume of the fan. However, the heat sink may be optimized, for example, and the heat sink may be arranged on the upper surface or the lower surface of the heat pipe 5 to ensure an optimum heat dissipation characteristic. That is, according to the present preferred embodiment, it is possible to improve an ability of the heat module 100 having a small thickness to cool the heat source 6 without adopting any heat sink.

An area between a first imaginary tangent 71 and a second imaginary tangent 72 and radially inside of the air outlet 36 is an area where air directly flows. Thus, when the contact portion 50 is arranged in the area where the air flows, the air current is able to strike the heat pipe 5. In addition, in the aforementioned area, the air flows at a relatively high speed, and when the contact portion 50 is arranged in the aforementioned area, the air current having a relatively high flow velocity is able to strike the heat pipe 5. In other words, the entire heat pipe 5 can thus be arranged closer to the impeller 4 or the air outlet 36 to increase efficiency of heat dissipation of the entire heat pipe 5.

At least a portion of the heat pipe 5 is arranged on a side of the air outlet 36 closer to the central axis J1. According to the present preferred embodiment, a distance between the edge of the upper plate portion 31 and the central axis J1 is equal to a distance between the edge of the lower plate portion 33 and the central axis J1. That is, the position of the air outlet 36 is as indicated in FIG. 2. Thus, the contact portion 50 is arranged on the side of the air outlet 36 closer to the central axis J1.

The air current flows most rapidly in the vicinity of an inner circumferential surface of the side wall portion 32. In addition, the density of air of the air current is highest in the vicinity of the inner circumferential surface of the side wall portion 32. Air diffuses horizontally as it travels away from the blades 41 of the impeller 4, and after the air is discharged through the air outlet 36, the air further diffuses at an increasing speed axially or horizontally depending on the embodiment of the present invention. The density of air decreases as the diffusion of the air progresses. As the density of air decreases, heat dissipation caused by striking of the air upon the heat pipe 5 is reduced in effectiveness. When at least a portion of the heat pipe 5 is arranged on the side of the air outlet 36 closer to the central axis J1, air which flows at a high speed and which has a high density is able to strike the heat pipe 5. Thus, heat dissipation efficiency of the heat pipe 5 is improved.

In a plan view, an imaginary straight line which is parallel to the air outlet 36 and which intersects with the central axis J1 is defined as a first imaginary straight line 81, and an imaginary straight line which is perpendicular to the air outlet 36 and which intersects with the central axis J1 is defined as a second imaginary straight line 82. Of four regions divided by the first and second imaginary straight lines 81 and 82, a region in which the tongue portion 320 is arranged is defined as a first region 801, and the three other regions are defined as a second region 802, a third region 803, and a fourth region 804 in an order in which the three regions are arranged in a rotation direction of the impeller 4 from the first region 801. At least a portion of the heat pipe 5 is arranged in the fourth region 804.

Air discharged radially outward from the impeller 4 gathers in the vicinity of the inner circumferential surface of the side wall portion 32, and forms an air current which flows downstream. The air increases in density as it travels downstream. The air is thereafter discharged through the air outlet 36, and decreases in density. That is, in the fourth region 804, the air has an increased density, and flows at the highest speed. Thus, air which has a high density and which flows at a high speed is able to strike the heat pipe 5.

The heat pipe 5 is arranged to overlap with at least a portion of each blade 41 in a plan view.

Rotation of the blades 41 causes a shear stress to be applied to air in the vicinity of the blades 41. Because the air is viscous, the air in the vicinity of the blades 41 travels in a rotation direction of the blades 41 owing to the shear stress. Further, air which has entered through the air inlet 35 is discharged radially outward along the blades 41. That is, in the vicinity of the blades 41, the air moves strikingly and flows at a high speed. Thus, the heat pipe 5 is arranged to overlap with at least a portion of each blade 41 in the plan view to allow the air to move in the vicinity of the surface of the heat pipe 5 and to directly strike the heat pipe 5.

In a plan view, the heat pipe 5 is arranged to extend along the inner circumferential surface of the side wall portion 32 between the side wall portion 32 and outer ends of the blades 41, and is arranged to overlap at least in part with an imaginary envelope 40 which joins the outer ends of the blades 41 in an area radially inside of a radially outer end of the heat pipe 5.

A wind blown out by the rotation of the blades 41 travels most rapidly in the vicinity of the inner circumferential surface of the side wall portion 32. In addition, in the vicinity of the blades 41, the circumferential speed of the wind caused by the rotation of the blades 41 is highest at radially outer ends of the blades 41. Thus, when the heat pipe 5 is arranged between the inner circumferential surface of the side wall portion 32 and the outer ends of the blades 41, an air current having a high flow velocity is able to strike the heat pipe 5.

The heat pipe 5 according to the present preferred embodiment includes a first heat pipe portion 51, a curved portion 52, and a second heat pipe portion 53. The first heat pipe portion 51 is arranged to extend along the air outlet 36. The curved portion 52 is arranged on a side of the first heat pipe portion 51 closer to the aforementioned opposite end of the heat pipe 5, and has the greatest curvature within the heat pipe 5. The second heat pipe portion 53 is arranged on a side of the curved portion 52 closer to the aforementioned opposite end of the heat pipe 5. At least a portion of the contact portion 50 is included in the second heat pipe portion 53.

The heat pipe 5 is curved substantially in horizontal directions. This leads to increasing a surface area of the heat pipe 5 in a horizontal space through which the air current passes. Thus, a large amount of air passes the heat pipe 5, resulting in an improvement in the heat dissipation characteristic.

Referring to FIG. 2, a minimum distance between the curved portion 52 and the central axis J1 is greater than a minimum distance between the second heat pipe portion 53 and the central axis J1.

If the heat pipe 5 were arranged away from the air outlet 36 in a direction along which the air current flows, the flow velocity of the air current when the air current strikes the heat pipe 5 would be reduced, and because of diffusion of air, the amount of air which strikes the surface of the heat pipe 5 would also be reduced. In contrast, according to the present preferred embodiment, a portion of the heat pipe 5 on a side of the curved portion 52 closer to a top of the heat pipe 5 is arranged close to the impeller 4, and thus, an air current which has a relatively high wind velocity strikes the heat pipe 5, and the air current strikes the heat pipe 5 before diffusion of the air current progresses. Thus, a cooling characteristic of the heat pipe 5 is improved.

A maximum curvature of the curved portion 52 is greater than a maximum curvature of the impeller 4. As the curvature of the curved portion 52 increases, the surface area of the heat pipe 5 in the horizontal space through which the air current passes can increase.

The aforementioned opposite end of the heat pipe 5 may be arranged in the third region 803. In other words, it is enough that at least a portion of the heat pipe 5 is arranged in the fourth region 804. The heat pipe 5 may be arranged to extend further upstream beyond the fourth region 804 with respect to the rotation direction of the impeller 4 such that portions of the heat pipe 5 are arranged in both the fourth region 804 and the third region 803.

A portion of the heat pipe 5 may be arranged to extend from the fourth region 804 to the air outlet 36. As described above, in the fourth region 804, the air current flows at the highest speed, and the density of air is high. When the heat pipe 5 is arranged to extend into the third region 803, a portion of the heat pipe 5 can be arranged to extend over an entire circumferential extent of the fourth region 804, resulting in an improvement in the heat dissipation characteristic of the heat pipe 5.

In the upper surface of the lower plate portion 33 or the lower surface of the upper plate portion 31, a portion which is in contact with the contact portion 50 of the heat pipe 5 is a recessed portion 30a, that is recessed axially downward or axially upward relative to a remaining portion 30b, and the recessed portion which is in contact with the contact portion 50 of the heat pipe 5 is joined to the remaining portion through a shoulder portion 30.

Air which flows over the upper surface of the lower plate portion 33 interferes with the heat pipe 5 to cause an eddy and noise. Thus, according to the present preferred embodiment, the shoulder portion 30 serves to reduce a difference between the axial position of the upper surface of the heat pipe 5 and the axial position of the upper surface of the lower plate portion 33. This contributes to reducing interference of the air which flows over the upper surface of the lower plate portion 33 with the heat pipe 5, and to reducing the level of the noise. In addition, provision of the shoulder portion 30 narrows the air channel. This increases the flow velocity of the air current, so that the flow velocity of the air current which passes the heat pipe 5 is increased. As a result, heat dissipation performance of the heat pipe 5 is improved.

The aforementioned remaining portion of the upper surface of the lower plate portion 33 or of the lower surface of the upper plate portion 31 and an opposite surface of the heat pipe 5 to the contact portion 50 are arranged to be flush with each other.

When the upper surfaces of the heat pipe 5 and the lower plate portion 33 are arranged to be flush with each other, noise caused by interference of air which passes the lower plate portion 33 with the heat pipe 5 is minimized.

A gap is defined between the surface of the heat pipe 5, the surface including the contact portion 50, and the lower plate portion 33 or the upper plate portion 31.

When the lower surface of the heat pipe 5 is arranged at a level higher than that of the upper surface of the lower plate portion 33, air is able to flow both above the upper surface of the heat pipe 5 and below the lower surface of the heat pipe 5. Thus, the heat dissipation characteristic of the heat pipe 5 is improved. It is desirable that a lower surface of the first heat pipe portion 51 be arranged at a level higher than that of the upper surface of the lower plate portion 33.

Figure 3:
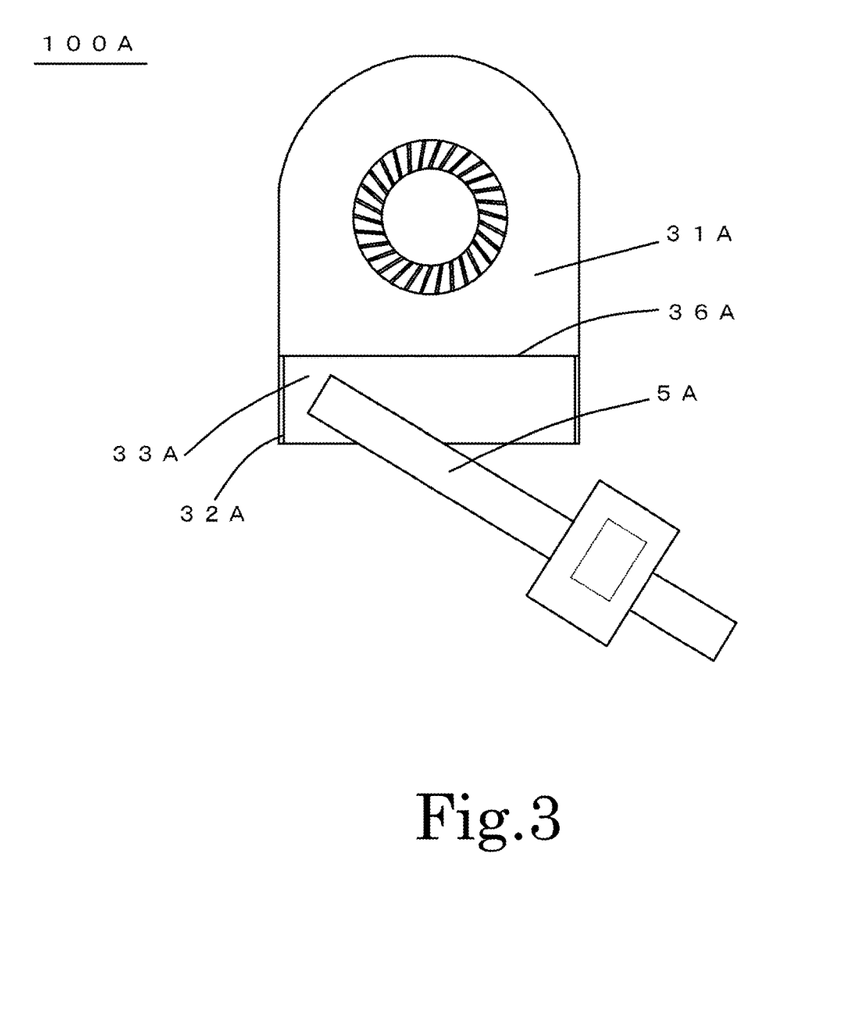
FIG. 3 is a top view of the heat module according to a second preferred embodiment of the present invention.

FIG. 3 is a plan view of a heat module 100A according to a second preferred embodiment of the present invention. The basic structure of the heat module 100A according to the second preferred embodiment is identical to the basic structure of the heat module 100 according to the first preferred embodiment. Accordingly, a description of the second preferred embodiment will be limited to differences from the first preferred embodiment. According to the second preferred embodiment, an edge of an upper plate portion 31A is arranged on a side of an edge of a lower plate portion 33A and edges of a side wall portion 32A closer to a central axis J1A. Accordingly, an air outlet 36A is arranged closer to the central axis J1A than an end of a heat pipe 5A at which the heat pipe 5A is in thermal contact with a fan 1A. The heat pipe 5A according to a preferred embodiment of the present invention includes no curved portion 52, and is arranged to extend in a straight line.

Figure 4:
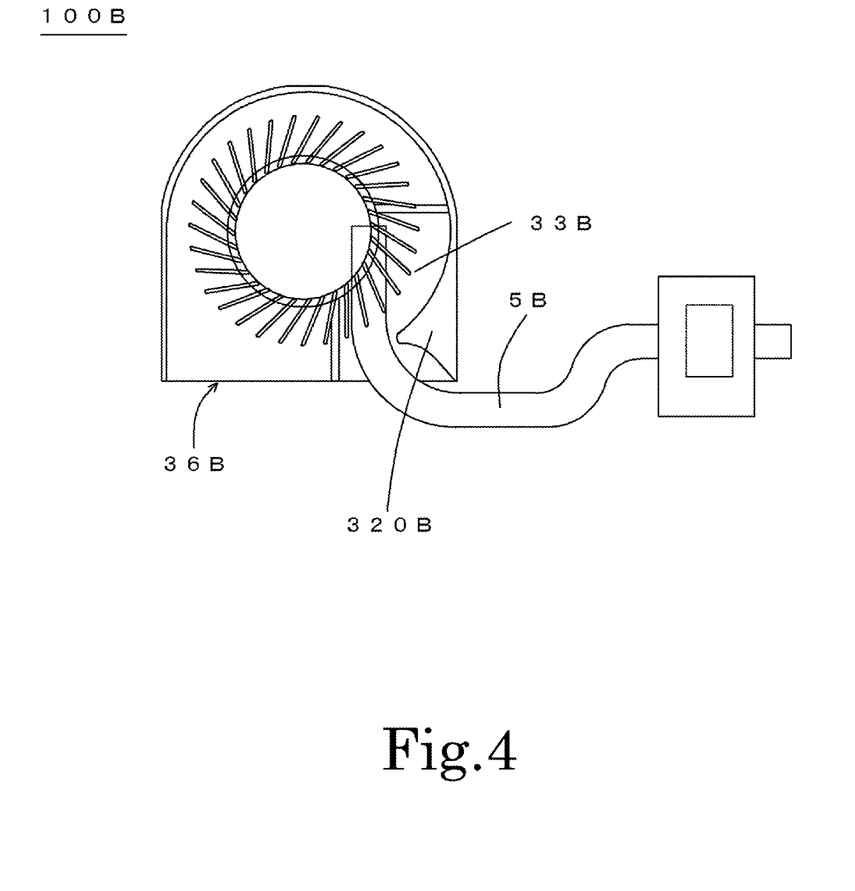
FIG. 4 is a top view of a heat module according to a third preferred embodiment of the present invention.

FIG. 4 is a plan view of a heat module 100B according to a third preferred embodiment of the present invention. The basic structure of the heat module 100E according to the third preferred embodiment is identical to the basic structure of the heat module 100 according to the first preferred embodiment. Accordingly, a description of the third preferred embodiment will be limited to differences from the first preferred embodiment. According to the third preferred embodiment, one end of a heat pipe 5B at or near which the heat pipe 5B is in thermal contact with a fan is fixed to an upper surface of a lower plate portion 33B in the vicinity of a tongue portion 320B. Even in this case, when at least a portion of the heat pipe 5B is arranged on a side of an air outlet 36B closer to a central axis (not shown), an air current having a high flow velocity and a high density of air is able to strike the heat pipe 5B. Thus, heat dissipation efficiency of the heat pipe 5B is improved.

Figure 5:
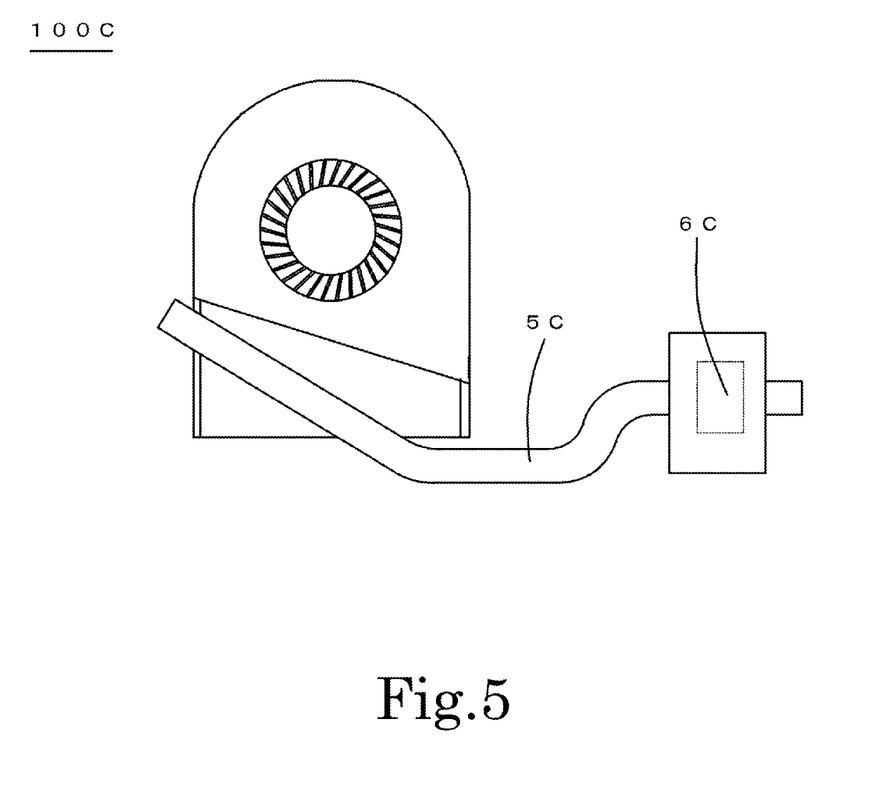
FIG. 5 is a top view of a heat module according to a fourth preferred embodiment of the present invention.

FIG. 5 is a plan view of a heat module 100C according to a fourth preferred embodiment of the present invention. The basic structure of the heat module 100C according to the fourth preferred embodiment is identical to the basic structure of the heat module 100 according to the first preferred embodiment. Accordingly, a description of the fourth preferred embodiment will be limited to differences from the first preferred embodiment. As illustrated in FIG. 5, one end of a heat pipe 5C at or near which the heat pipe 5C is in thermal contact with a fan may be arranged radially outside of a radially outer edge of an upper plate portion 31C, a side wall portion 32C, or a lower plate portion 33C.

The heat pipe 5C includes a capillary structure and a coolant arranged therein. Thus, an end portion of the heat pipe 5C is crushed for sealing so that the coolant may not flow out of the heat pipe 5C. Accordingly, at the end portion of the heat pipe 5C, the coolant does not vaporize or condense to accomplish a heat transfer function. That is, only a portion of the heat pipe 5C at which the coolant carries out the heat transfer function can be arranged in a horizontal space through which an air current passes. Thus, heat dissipation performance can be improved to optimize efficiency in transfer of heat from a heat source 6C.

Figure 6:
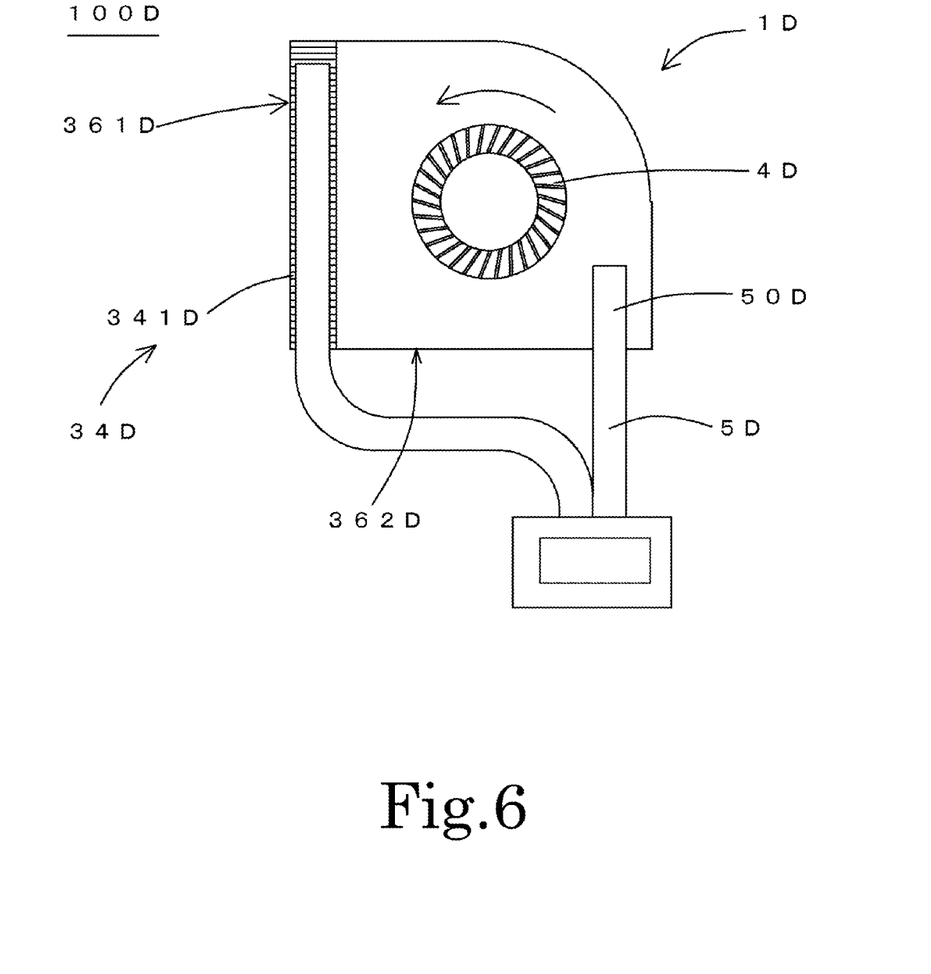
FIG. 6 is a top view of a heat module according to a fifth preferred embodiment of the present invention.

FIG. 6 is a plan view of a heat module 100D according to a fifth preferred embodiment of the present invention. The basic structure of the heat module 100D according to the fifth preferred embodiment is identical to the basic structure of the heat module 100 according to the first preferred embodiment. Accordingly, a description of the fifth preferred embodiment will be limited to differences from the first preferred embodiment. A fan 1D according to the fifth preferred embodiment includes two air outlets. The fan 1D includes a first air outlet 361D and a second air outlet 362D arranged downstream of the first air outlet 361D with respect to a rotation direction of an impeller 4D. A heat sink 34D is arranged at the first air outlet 361D. The heat sink 34D includes a plurality of fins 341D. The fins 341D are a plurality of heat dissipating fins arranged in parallel with one another, each heat dissipating fin being substantially in the shape of the letter "U" and including an upper surface portion, a vertical surface portion, and a bottom surface portion, for example. With the heat dissipating fins being arranged in parallel with one another, the upper surface portion, the bottom surface portion, and the vertical surface portion of each heat dissipating fin and the vertical surface portion of an adjacent one of the heat dissipating fins together define a passage having a rectangular cross section. A wind caused by the fan 1D passes through this passage. A contact portion 50D of a heat pipe 5D is arranged on a side of the second air outlet 362D closer to a central axis (not shown).

Centrifugal fans according to preferred embodiments of the present invention are usable to cool devices inside cases of notebook PCs and desktop PCs, to cool other devices, to supply air to a variety of objects, and so on. Moreover, centrifugal fans according to preferred embodiments of the present invention are also usable for other purposes.

Features of the above-described preferred embodiments and the modifications thereof may be combined appropriately as long as no conflict arises.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A heat module comprising:
a fan comprising:
a housing comprising an upper plate portion, a side wall portion, a lower plate portion and an air outlet, an entire edge of the upper plate portion consisting of a first part and a second part, an entire edge of the lower plate portion consisting of a third part and a fourth part, the side wall portion extending between the first part and the third part, an inside space formed by surrounding the upper plate portion, the side wall portion and the lower plate portion,
an impeller including a plurality of blades, the impeller rotatable about a central axis of the impeller, the impeller accommodated in the inside space, the central axis perpendicular to the upper plate portion and the lower plate portion; and
a motor for rotating the impeller about the central axis, the motor accommodated in the inside space, the motor supported by the lower plate portion; and
a heat pipe comprising:
a first end region including a first end, the first end region provided in the inside space; and
a second end region including a second end, the second end region provided outside the inside space, the second end opposite to the first end, the second end region arranged to be in thermal contact with a heat source provided outside the inside space; and
a contact portion arranged in the first end region, the contact portion being in contact with one of an upper surface of the lower plate portion and a lower surface of the upper plate portion;
wherein in a plan view which is perpendicular to the central axis, the air outlet is defined by a straight line made of at least one of the second part and the fourth part,
wherein in the plan view, at least a portion of the heat pipe extends at an angle with respect to the straight line of the air outlet,
wherein the heat pipe is arranged to overlap with at least a portion of each of the blades in the plan view,
wherein said one of the upper surface of the lower plate portion and the lower surface of the upper plate portion, being in contact with the contact portion, comprises:
a recessed portion,
a remaining portion, and
a shoulder portion extended between the recessed portion and the remaining portion,
wherein the recessed portion is recessed from the remaining portion, such that the first end region is accommodated in the recessed portion.

2. The heat module according to claim 1, wherein the impeller has a rotation direction, wherein the side wall portion in the plan view extends from an upstream end through a curved portion to a downstream end,
wherein in the plan view, an imaginary envelope being a circle is made by outer ends of the blades when the impeller is rotated,
wherein, in the plan view, at least a portion of the contact portion is arranged in an area surrounded by a first imaginary tangent, a second imaginary tangent, and the air outlet, the first imaginary tangent being defined by a line drawn from the downstream end to the upstream to be tangent to the imaginary envelope, and the second imaginary tangent being defined by a line drawn from the upstream end to the upstream to be tangent to the imaginary envelope.

3. The heat module according to claim 2, wherein, in the plan view, the first end region is arranged to extend along an inner circumferential surface of the side wall portion, and is arranged to overlap at least in part with the imaginary envelope.

4. The heat module according to claim 1, wherein the first end region of the heat pipe is arranged closer to the central axis than the air outlet.

5. The heat module according to claim 1, wherein the impeller has a rotation direction, wherein the side wall portion in the plan view extends from an upstream end through a curved portion to a downstream end,
wherein the side wall portion in the plan view includes a tongue portion provided in the inside space to project toward the downstream end, and
wherein in the plan view, a first imaginary straight line is drawn to pass through the central axis to be parallel to the straight line of the air outlet, and a second imaginary straight line is drawn to pass through the central axis to be perpendicular to the straight line of the air outlet, such that a first region, a second region, a third region, and a fourth region are made in order of the rotation direction, the first region includes the tongue portion while the first end region is arranged in the fourth region.

6. The heat module according to claim 5, wherein the first end of the heat pipe is arranged in the third region.

7. The heat module according to claim 1, wherein
the heat pipe further comprising:
a first heat pipe portion parallel to the straight line of the air outlet, the first heat pipe portion provided outside the inside space; and
a curved portion arranged closer to the first end of the heat pipe than the first heat pipe portion, and the curved portion having the greatest curvature within the heat pipe; and
a second heat pipe portion arranged closer to the first end of the heat pipe than the curved portion; and
at least a portion of the contact portion is included in the second heat pipe portion.

8. The heat module according to claim 7, wherein a minimum distance between the curved portion and the central axis is greater than a minimum distance between the second heat pipe portion and the central axis.

9. The heat module according to claim 8, wherein a maximum curvature of the curved portion is greater than a maximum curvature of the impeller.

10. The heat module according to claim 7, wherein a maximum curvature of the curved portion is greater than a maximum curvature of the impeller.

11. The heat module according to claim 7,
wherein said one of the upper surface of the lower plate portion and the lower surface of the upper plate portion, being in contact with the contact portion, comprises:
a recessed portion,
a remaining portion, and
a shoulder portion extended between the recessed portion and the remaining portion,
wherein the recessed portion is recessed from the remaining portion such that the first end region of the heat pipe is accommodated in the recessed portion.

12. The heat module according to claim 11, wherein the remaining portion and the first end region are arranged to be flush with each other.

13. The heat module according to claim 7, wherein in the plan view, the curved portion overlaps with the air outlet.

14. The heat module according to claim 1, wherein the second end of the heat pipe is arranged radially outside the upper plate portion, the side wall portion, or the lower plate portion.

15. The heat module according to claim 1, wherein said one of the lower plate portion and the upper plate portion with which the contact portion is in contact is made of a material having excellent thermal conductivity.

16. The heat module according to claim 1, wherein the heat pipe has a flat cross section.

17. The heat module according to claim 1, wherein the remaining portion and the first end region are arranged to be flush with each other.

18. The heat module according to claim 1, wherein a gap is defined between a surface of the heat pipe, the surface including the contact portion, and the lower plate portion or the upper plate portion.

* * * * *